（12）United States Patent
Hoentschel et al.

(10) Patent No.: US 8,329,531 B2
(45) Date of Patent: Dec. 11, 2012

(54) STRAIN MEMORIZATION IN STRAINED SOI SUBSTRATES OF SEMICONDUCTOR DEVICES

(75) Inventors: Jan Hoentschel, Dresden (DE); Sven Beyer, Dresden (DE); Uwe Griebenow, Markleeberg (DE); Thilo Scheiper, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/917,870

(22) Filed: Nov. 2, 2010

(65) Prior Publication Data

US 2011/0210427 A1    Sep. 1, 2011

(30) Foreign Application Priority Data

Feb. 26, 2010    (DE) .......... 10 2010 002 410

(51) Int. Cl.
*H01L 21/8238* (2006.01)
*H01L 21/76* (2006.01)
*H01L 21/36* (2006.01)
*H01L 21/4763* (2006.01)
*H01L 21/311* (2006.01)
*H01L 21/469* (2006.01)

(52) U.S. Cl. ........ 438/218; 438/222; 438/424; 438/478; 438/589; 438/702; 438/762; 438/783; 257/E21.131; 257/E21.409; 257/E21.546; 257/E21.703

(58) Field of Classification Search .......... 257/E21.131, 257/E21.409, E21.546, E21.703
See application file for complete search history.

(56) References Cited

U.S. PATENT DOCUMENTS

| 6,723,661 | B2 * | 4/2004 | Fitzergald ............. 438/763 |
| 6,787,423 | B1 * | 9/2004 | Xiang ............. 438/296 |
| 7,193,322 | B2 * | 3/2007 | Lee et al. ............. 257/745 |
| 2007/0123008 | A1 * | 5/2007 | Xie et al. ............. 438/478 |
| 2007/0246742 | A1 * | 10/2007 | Meunier-Beillard et al. . 257/190 |
| 2009/0140348 | A1 * | 6/2009 | Frohberg et al. ............. 257/369 |
| 2010/0015771 | A1 * | 1/2010 | Hsieh ............. 438/275 |
| 2010/0055867 | A1 * | 3/2010 | Hoentschel et al. ............. 438/424 |
| 2010/0308379 | A1 * | 12/2010 | Kuan et al. ............. 257/288 |
| 2011/0049637 | A1 * | 3/2011 | Wiatr et al. ............. 257/368 |
| 2011/0101456 | A1 * | 5/2011 | Hoentschel et al. ............. 257/347 |

\* cited by examiner

*Primary Examiner* — Mohsen Ahmadi
(74) *Attorney, Agent, or Firm* — Williams, Morgan & Amerson, P.C.

(57) ABSTRACT

In sophisticated semiconductor devices, the initial strain component of a globally strained semiconductor layer may be substantially preserved during the formation of shallow trench isolations by using a rigid mask material, which may efficiently avoid or reduce a deformation of the semiconductor islands upon patterning the isolation trenches. Consequently, selected regions with high internal stress levels may be provided, irrespective of the height-to-length aspect ratio, which may limit the application of globally strained semiconductor layers in conventional approaches. Furthermore, in some illustrative embodiments, active regions of substantially relaxed strain state or of inverse strain type may be provided in addition to the highly strained active regions, thereby enabling an efficient process strategy for forming complementary transistors.

14 Claims, 8 Drawing Sheets

STRAIN MEMORIZATION IN STRAINED SOI SUBSTRATES OF SEMICONDUCTOR DEVICES

BACKGROUND OF THE INVENTION

1. Field of the Invention

Generally, the present disclosure relates to the field of integrated circuits, and, more particularly, to the manufacture of transistors having strained channel regions by using stress-inducing sources, such as globally strained silicon substrates and the like, in order to enhance charge carrier mobility in the channel region of a MOS transistor.

2. Description of the Related Art

Generally, a plurality of process technologies are currently practiced to fabricate integrated circuits, wherein, for complex circuitry, such as microprocessors, storage chips and the like, CMOS technology is presently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions formed by an interface that is defined by highly doped drain and source regions and an inversely or weakly doped channel region disposed between the drain region and the source region. The conductivity of the channel region, i.e., the drive current capability of the conductive channel, is controlled by a gate electrode located in close proximity to the channel region and separated therefrom by a thin insulating layer. The conductivity of the channel region, upon formation of a conductive channel due to the application of an appropriate control voltage to the gate electrode, depends on, among other things, the mobility of the charge carriers and the channel length. Hence, the conductivity of the channel region is a dominant factor determining the performance of MOS transistors. Thus, the reduction of the channel length, and associated therewith the reduction of the channel resistivity, is an important design criterion for accomplishing an increase in the operating speed of the integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. For instance, the thickness of the gate insulation layer, frequently an oxide-based dielectric, has to be reduced with reducing the gate length, wherein a reduced thickness of the gate dielectric may result in increased leakage currents, thereby posing limitations for oxide-based gate insulation layers at approximately 1-2 nm. Thus, the continuous size reduction of the critical dimensions, i.e., the gate length of the transistors, necessitates the adaptation and possibly the new development of highly complex process techniques, for example, for compensating for short channel effects with oxide-based gate dielectric scaling being pushed to the limits with respect to tolerable leakage currents. It has, therefore, been proposed to also enhance the channel conductivity of the transistor elements by increasing the charge carrier mobility in the channel region for a given channel length, thereby offering the potential for achieving a performance improvement that is comparable with the advance to technology nodes using reduced gate lengths, while avoiding or at least postponing many of the problems encountered with the process adaptations associated with device scaling.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating uniaxial tensile strain in the channel region along the channel length direction for a standard crystallographic orientation increases the mobility of electrons, which in turn may directly translate into a corresponding increase in conductivity. On the other hand, uniaxial compressive strain in the channel region for the same configuration as above may increase the mobility of holes, thereby providing the potential for enhancing the performance of P-type transistors.

In some approaches, external stress, created by, for instance, permanent overlaying layers, spacer elements and the like, is used in an attempt to create a desired strain within the channel region. Although a promising approach, the process of creating the strain in the channel region by applying a specified external stress may depend on the efficiency of the stress transfer mechanism for the external stress provided, for instance, by contact layers, spacers and the like into the channel region to create the desired strain therein. Thus, for different transistor types, differently stressed overlayers have to be provided, which may result in a plurality of additional process steps, wherein, in particular, any additional lithography steps may significantly contribute to the overall production costs, while the resulting strain level may be less than desired, in particular for highly scaled transistors, due to limitations caused by deposition constraints of the highly stressed materials. Hence, the amount of stress-inducing material, and in particular the intrinsic stress thereof, may not be arbitrarily increased without requiring significant design alterations.

In other approaches, a strain-inducing semiconductor alloy may be provided within drain and source regions, which may exert a specified type of stress on the channel region to thereby induce a desired type of strain therein. For example, a silicon/germanium alloy may frequently be used for this purpose in order to obtain a compressive stress component in the adjacent channel region of, for instance, P-channel transistors in order to increase mobility of holes in the corresponding P-channel. In sophisticated applications, two or more of the above-specified strain-inducing mechanisms may be combined so as to further enhance the overall strain obtained in the corresponding channel regions. However, these strain-inducing mechanisms may be considered as "local" mechanisms, since the strain may be induced in and above the corresponding active region for the transistor element under consideration, wherein the finally obtained strain component in the channel region may significantly depend on the overall device dimensions. That is, typically, these local strain-inducing mechanisms may rely on the stress transfer capabilities via other device components, such as gate electrodes, spacer elements formed on sidewalls of the gate electrodes, the lateral dimensions of the drain and source regions and the like. Consequently, the magnitude of the strain in the channel region may significantly depend on the technology under consideration, since, typically, reduced device dimensions may result in an over-proportional reduction of the corresponding strain-inducing mechanism. For example, creating strain by a dielectric overlayer, such as a contact etch stop layer, may frequently be used, wherein, however, the amount of internal stress of the corresponding dielectric material may be restricted by deposition-related constraints while, at the same time, upon reducing device dimensions, for instance the spacing between two neighboring transistor elements, may require a significant reduction of the layer thickness, which may thus result in a reduction of the finally obtained strain component. For these reasons, typically, the magnitude of the strain in the channel region provided by the local strain-inducing mechanisms may be several hundred MPa, while a further increase of this value may be difficult to be achieved upon further device scaling.

For this reason, attention is again increasingly drawn to other mechanisms in which a moderately high degree of strain may be created in a global manner, i.e., on a wafer level, so that the corresponding active regions of the transistor elements may be formed in a globally strained semiconductor material, thereby providing a direct strain component in the corresponding channel regions. For instance, as one of the earliest strain techniques, a silicon material may be epitaxially grown on an appropriately designed buffer layer in order to obtain a strained silicon layer. For example, a silicon/germanium buffer layer which may be provided with its substantially natural lattice constant may be used for forming thereon a strained silicon layer, which may have a moderately high tensile biaxial strain of 1 GPa or higher, depending on the lattice mismatch between the buffer layer and the strained silicon layer. For example, a substantially relaxed silicon/germanium layer having a fraction of approximately 20 atomic percent germanium may result in a tensile biaxial strain of a corresponding epitaxially grown silicon material of 1.3 GPa, which is significantly higher compared to the strain levels obtained by the local strain-inducing mechanisms described above. The global biaxial strain in the silicon results in an increase of the degree of degeneration of the conduction band, thereby creating two sets of sub-valleys with different effective electron masses. An appropriate repopulation of the theses energy states thus leads to a higher electron mobility and hence a higher drive current of N-channel transistors.

The creation of a global strained silicon layer may also be efficiently accomplished on the basis of an SOI (silicon-on-insulator) architecture by sophisticated wafer bonding techniques. That is, a strained silicon layer may be formed on the basis of an appropriately designed buffer layer, as explained above, and the corresponding silicon layer may be bonded to a carrier wafer having formed thereon a silicon dioxide layer. After the bonding of the strained silicon layer to the carrier wafer, the strained semiconductor layer may be cleaved, for instance by incorporating an appropriate species, such as hydrogen, helium and the like, wherein the previously generated strain may be substantially maintained due to the adhesion of the strained silicon material on the material of the carrier wafer. Consequently, a globally strained silicon layer may also be provided in applications in which SOI architecture may be required, at least for performance driven transistor elements.

In principle, providing a globally strained semiconductor layer, for instance on the basis of an SOI architecture, may represent a promising approach, since the strain values may be significantly higher compared to local strain-inducing mechanisms. When applying a globally strained silicon-based layer in sophisticated semiconductor devices, it turns out, however, that, upon reducing the overall dimensions of circuit elements, the strain levels in the associated active regions is also reduced, as will be explained in more detail with reference to FIGS. 1a-1f.

FIG. 1a schematically illustrates a perspective view of a semiconductor substrate 101, such as a silicon wafer, which may comprise a base material 102, for instance in the form of silicon and the like, above which is formed a globally strained silicon layer 104, which may also comprise other components, such as dopants and the like, as required for forming sophisticated transistor elements in and above the semiconductor layer 104. Furthermore, as previously discussed, frequently, an SOI architecture is used in advanced semiconductor devices, wherein a buried insulating layer 103, such as a silicon dioxide material, is formed between the base material 102 and the semiconductor layer 104. The semiconductor layer 104 may have a high biaxial strain component, such as a tensile strain, as indicated by 104T, which may have a magnitude of several hundred MPa, or one 1 GPa and higher. As previously discussed, the substrate 101 may be fabricated on the basis of well-established wafer bond techniques, in which the semiconductor layer 104 may be grown on an appropriate crystalline template material having an appropriate crystallographic configuration so as to grow the semiconductor material of the layer 104 with a desired strain. For example, a silicon/germanium material may frequently be used as a template or buffer material, wherein the lattice mismatch between the relaxed silicon/germanium material and the natural lattice constant of a silicon material may result in a tensile strained deposition of the semiconductor material of the layer 104. The desired high tensile strain component may be preserved upon bonding the semiconductor layer 104 to the buried insulating layer 103, thereby obtaining the substrate 101 after removing the material of the template or buffer layer and the corresponding carrier substrate.

FIG. 1b schematically illustrates a cross-sectional view of a portion of the substrate 101. As illustrated, the semiconductor layer 104 with the desired high tensile strain 104T is formed on the buried insulating layer 103. Thus, upon forming sophisticated semiconductor devices on the basis of the substrate 101, the semiconductor layer 104 is to be patterned, for instance, for defining appropriate semiconductor regions or active regions, in and above which circuit elements, such as transistors, are to be formed. Typically, corresponding semiconductor regions are laterally delineated by appropriate isolation structures, such as shallow trench isolations, which, however, may have a significant influence on the resulting strain conditions within the individual active regions.

FIG. 1c schematically illustrates the substrate 101 in a further advanced manufacturing stage. As illustrated, an active region 104A is provided in the semiconductor layer 104, wherein the lateral size and position of the active region 104A is defined by a shallow trench isolation 104C. Hence, the shallow trench isolation 104C laterally delineates the active region 104A, which in turn may be vertically delineated by the buried insulating material 103.

Typically, the substrate 101 as illustrated in FIG. 1c is formed on the basis of the following process techniques. After providing the substrate 101, as for instance shown in FIGS. 1a and 1b, the semiconductor layer 104 may be patterned on the basis of sophisticated lithography techniques in order to form an isolation trench in the layer 104, which corresponds to the trench isolation structure 104C. To this end, any appropriate process strategy may be applied, for instance providing any sacrificial material layers, such as a pad layer, a chemical mechanical polishing (CMP) stop layer and the like, in accordance with the overall process requirements. Next, these optional sacrificial materials may be patterned and may be used for forming appropriate trenches on the basis of a resist mask, which may be accomplished by applying selective plasma-assisted etch recipes. Thus, upon forming an isolation trench, additional surface areas of the semiconductor material in the layer 104 may be created, for instance corresponding sidewall areas 104S are formed which thus represent exposed semiconductor surface areas, at which significantly different strain conditions may occur. That is, upon forming the additional free surface areas 104S, the initial strain component may be significantly reduced, thereby creating a modified strain profile, as indicated by the dashed line 104M, which may represent a boundary within which a moderately high tensile strain may still be preserved, while, within the portion of the active region 104A adjacent to the isolation structure 104C, may have significantly reduced strain components or a substantial relaxed strain condition is generated.

FIGS. 1*d*-1*f* schematically illustrate the substrate 101 according to various examples, in which the active region 104A may be formed on the basis of reduced lateral dimensions, at least along a length direction, as indicated by L. For example, in FIG. 1*d*, a length of the active region 104A may be reduced compared to the active region 104A as shown in FIG. 1*c*, as may be required in more sophisticated semiconductor devices. Upon reducing the length L of the active region 104A for a given height or thickness, as indicated by H, it turns out that the resulting tensile stress level 104T may further be reduced, while also the strain profile 104M results in an increased area of the active region 104A which may have a non-acceptable reduced strain level or which may even have, for instance, locally at the center, an inverse strain component.

FIG. 1*e* schematically illustrates the situation for an even further reduced length of the active region 104A, wherein the resulting strain level 104T is further reduced, while at the same time the relaxed areas or areas of inverse strain 104M are even further increased.

FIG. 1*f* schematically illustrates the situation for a height-to-length aspect ratio of approximately 1, wherein the corresponding strain level 104T may be substantially eliminated so that any performance enhancement may no longer be achieved due to the disadvantageous height-to-length aspect ratio.

Consequently, the patterning of the highly strained semiconductor layer 104 may finally result in the extremely reduced strain component for sophisticated semiconductor devices, which may be caused by the generation of semiconductor islands, in which the fraction of free surface areas with respect to strained surface areas may increase, thereby significantly reducing the efficiency of the corresponding strain-inducing mechanism.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which the effect of strain relaxation upon patterning a semiconductor layer may be significantly reduced by providing a strain memorization mechanism upon patterning the globally strained semiconductor material. To this end, in some illustrative aspects disclosed herein, an appropriate mask material may be provided above a specific portion of the globally strained semiconductor material and may be preserved during the patterning of the semiconductor material, wherein the mask material may provide superior mechanical stability of the underlying semiconductor island, thereby reducing the strain relaxation. For instance, the mask material may be provided in the form of a rigid material, which is to be understood as a material suffering from a lower mechanical deformation when being subjected to a change in stress conditions compared to the semiconductor material under consideration. In some illustrative embodiments disclosed herein, the mask material may be provided in the form of a highly stressed material, which may even further reduce any stress relaxation upon patterning the underlying semiconductor material. Hence, upon forming any additional free surface areas upon patterning the globally strained semiconductor layer, the mask material may efficiently suppress or at least significantly reduce the strain relaxation so that, upon refilling the isolation trenches by any appropriate fill material, the semiconductor island may be efficiently embedded, thereby also reducing or substantially avoiding any additional strain relaxation upon removing the mask material. Consequently, a significant amount of the initial global strain component may be preserved. In other illustrative aspects disclosed herein, in addition to preserving a significant amount of the initial strain component in some active regions, an efficient reduction or even inversion of the initial strain component may be accomplished in other active regions, thereby enabling a very efficient implementation of circuit elements, which may require different strain conditions in their active regions.

One illustrative method disclosed herein comprises providing a silicon-containing semiconductor layer above a substrate, which has a biaxial strain of a first type. The method further comprises forming a rigid mask material above the silicon-containing semiconductor layer. Moreover, the method comprises forming an isolation trench in the silicon-containing semiconductor layer in the presence of the rigid mask material so as to laterally delineate an active region, wherein the rigid mask material reduces a strain relaxation in the active region. The method further comprises filling the isolation trench with a dielectric material in the presence of the rigid mask material so as to form a trench isolation structure and removing the rigid mask material from the active region.

A further illustrative method disclosed herein comprises forming a mask material above a strained silicon-containing semiconductor layer that is formed above a substrate of a semiconductor device. The method additionally comprises forming an isolation structure in the strained silicon-containing semiconductor layer in the presence of the mask material, wherein the isolation structure laterally delineates a first active region below the mask material and a second active region that is laterally offset from the mask material. Finally, the method comprises removing the mask material.

One illustrative semiconductor device disclosed herein comprises a first active region formed above a substrate and having a first type of strain. The semiconductor device further comprises a second active region formed above the substrate and having a second type of strain that differs from the first type of strain. Additionally, the semiconductor device comprises a trench isolation structure formed laterally adjacent to the first and second active regions, wherein the trench isolation structure comprises a first dielectric material adjacent to the first active region and comprises a second dielectric material adjacent to the second active region, and wherein the first and second dielectric materials have a different internal stress level so as to selectively increase one of the first and second types of strain.

BRIEF DESCRIPTION OF THE DRAWINGS

The disclosure may be understood by reference to the following description taken in conjunction with the accompanying drawings, in which like reference numerals identify like elements, and in which.

Figure 1A:
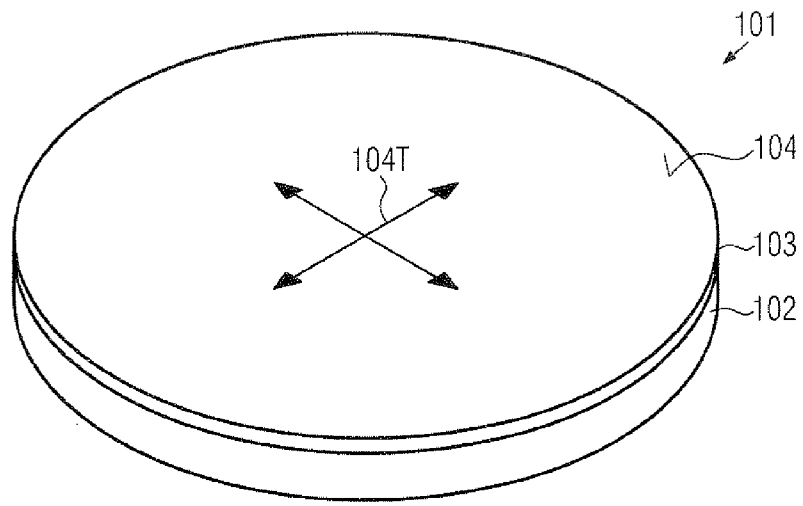
FIG. 1a schematically illustrates a perspective view of a substrate comprising a globally strained semiconductor material.
Figure 1B:
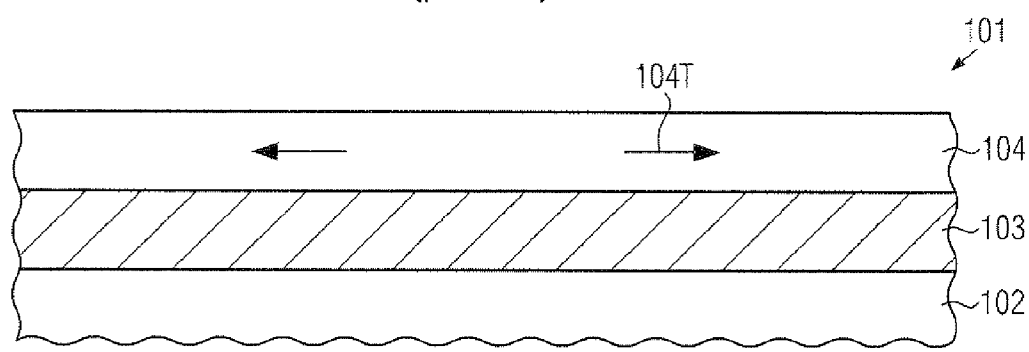
FIGS. 1b-1f schematically illustrate cross-sectional views of the substrate according to various examples, in which active regions of different lengths may result in an increasingly pronounced reduction of the initial biaxial strain, according to conventional strategies.
Figure 1C:
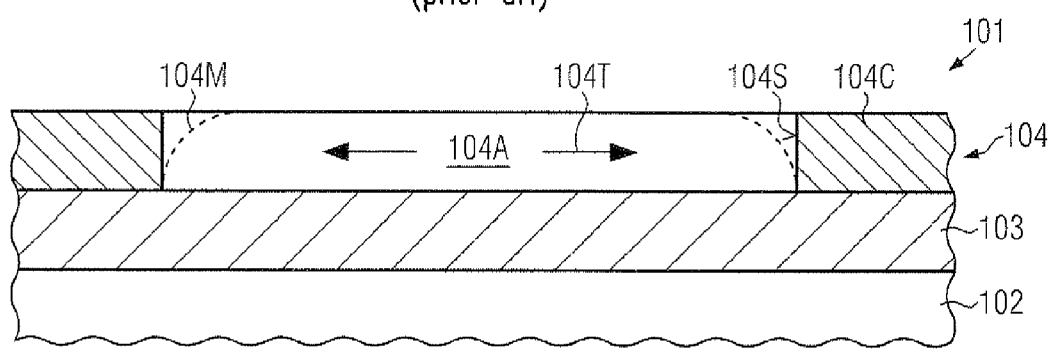
Figure 1D:
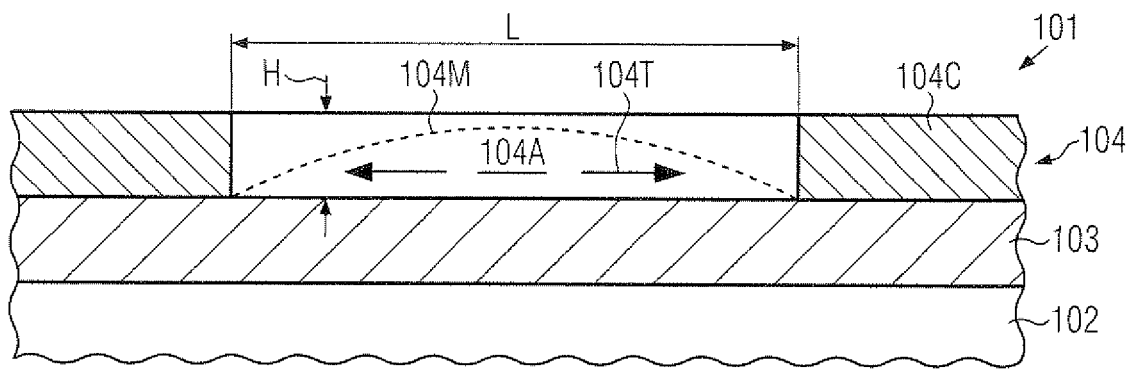
Figure 1E:
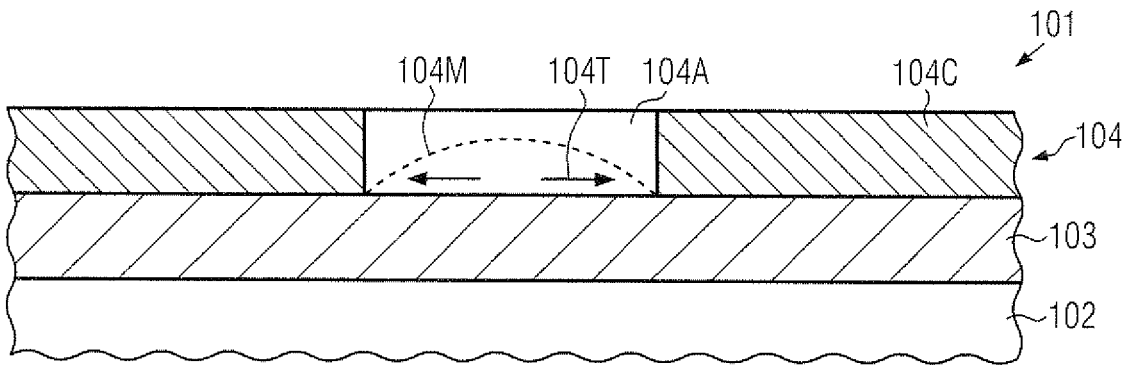
Figure 1F:
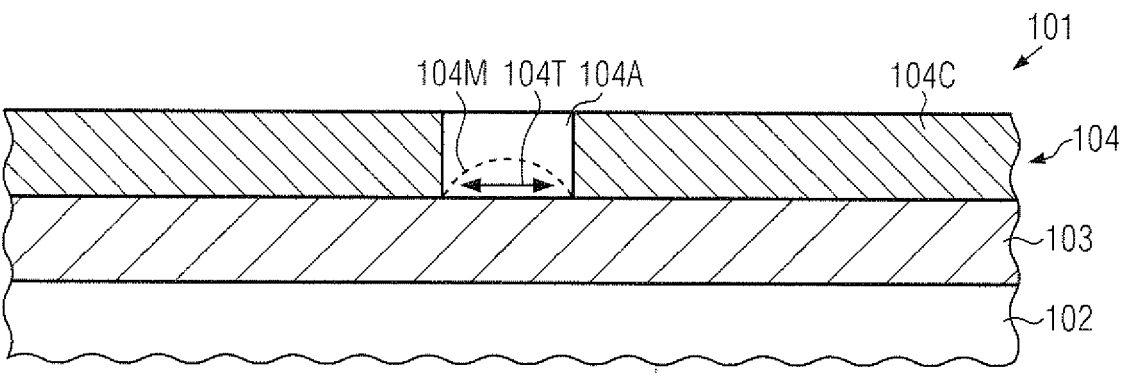

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques and semiconductor devices comprising sophisticated circuit elements which may be formed on the basis of a globally strained semiconductor material, wherein a moderately high fraction of the initial strain may be preserved when patterning the globally strained semiconductor material. To this end, an appropriate mask material may be formed above a portion of the semiconductor layer in which the initial high strain component is to be preserved, at least to a significant fraction. The mask material may have any appropriate mechanical characteristics so as to significantly reduce the degree of strain relaxation upon patterning the globally strained semiconductor layer, i.e., upon forming isolation trenches so as to laterally delineate the portion of the semiconductor layer under consideration. Hence, although additional free surface areas, such as exposed sidewall areas of a portion of an active region, are created upon patterning the isolation trench, the mask material formed is in mechanical contact with the top surface of the active region and may act as a non-deformable material, which may thus substantially maintain the size and shape of the active region, thereby substantially avoiding or at least significantly reducing a deformation and thus strain relaxation in the underlying semiconductor material. For example, silicon nitride material may represent a very efficient mask material, since silicon nitride is a rigid material which may be deformed in a significantly less degree compared to silicon material when being exposed to a change in stress conditions, which may occur at the edge areas of an active region upon forming an isolation trench. In some illustrative embodiments, the mask material may additionally be provided with a high internal stress level, which may induce a strain in the underlying semiconductor material that is of the same type as the initial strain component. In this manner, the strain memorization effect of the mask material may be even further enhanced. It is well known that a plurality of materials, such as silicon nitride and the like, may be deposited so as to have a high internal stress level, wherein the magnitude of the stress level may be readily adjusted on the basis of selecting appropriate process parameters for a given thickness of the mask material. In this manner, the resulting strain level in the underlying semiconductor material may be adjusted prior to refilling the isolation trench, which may then provide the desired mechanical stability by laterally enclosing the strained active region. Consequently, upon removing the mask material, the previously established strain component may be substantially preserved and may thus provide superior strain conditions in the active region, substantially irrespective of the height-to-length aspect ratio of the active region.

In some illustrative embodiments, the fill material of the isolation structure may be provided such that superior strain conditions may also be established in the adjacent active region, for instance by appropriately selecting an internal stress level of the fill material, thereby allowing superior flexibility in designing the overall strain conditions in the active region.

In still other illustrative embodiments, the strain memorization may be selectively applied so that any active regions which may not require the initial high strain component may be provided with a significantly reduced initial strain, or may even be provided with an inverse type of strain, thereby enabling the application of transistors of different conductivity type with superior performance and the like. Since providing the mask material for preserving at least a significant amount of the initial global strain may be efficiently combined with forming trench isolation structures, superior strain conditions may be established in an early manufacturing phase without unduly increasing complexity of the overall manufacturing process. Furthermore, since the strain in the active regions may be preserved in an efficient manner without being restricted to certain height-to-length aspect ratios, the principles disclosed herein may be advantageously applied to sophisticated semiconductor devices in which critical dimensions of circuit elements, such as transistors, may be in the range of approximately 40 nm and less. Moreover, the efficient strain engineering on the basis of a globally strained semiconductor material may be applied to planar transistor configurations and also to three-dimensional transistors, such as finFET transistors and the like. For example, the semiconductor bodies or fins of any such three-dimensional transistors may also be efficiently formed on the basis of the principles disclosed herein, since the initial strain component may be efficiently preserved, at least to a significant degree, irrespective of the shape and the aspect ratio of the semiconductor bodies.

Figure 2A:
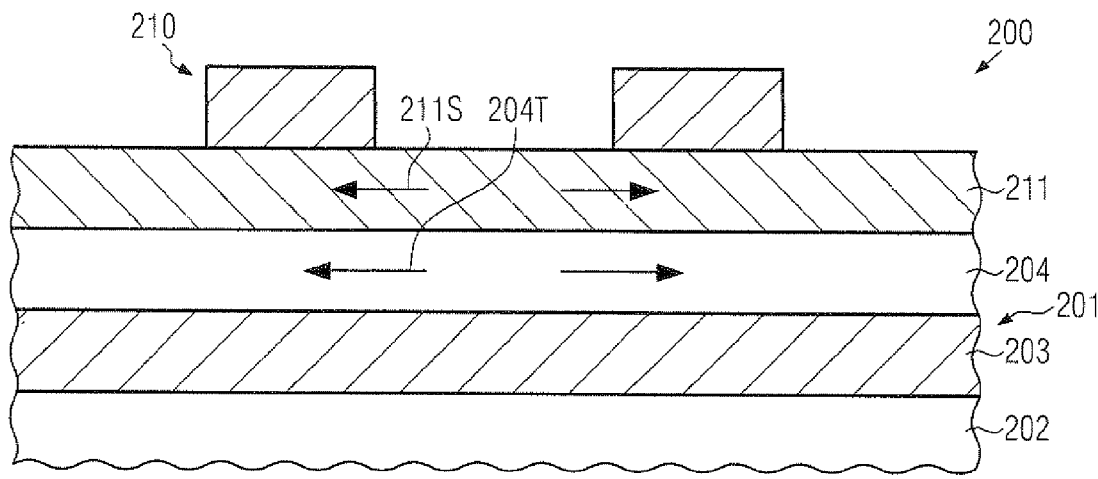
FIGS. 2a-2d schematically illustrate cross-sectional views of a semiconductor device during various manufacturing stages in forming strained active regions from a globally strained semiconductor layer on the basis of a mask material configured for preserving a significant amount of the initial strain, according to illustrative embodiments.
Figure 2B:
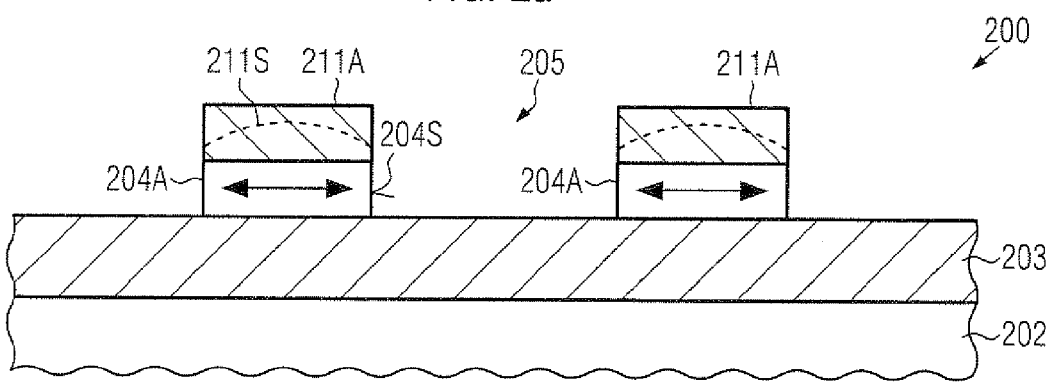
Figure 2C:
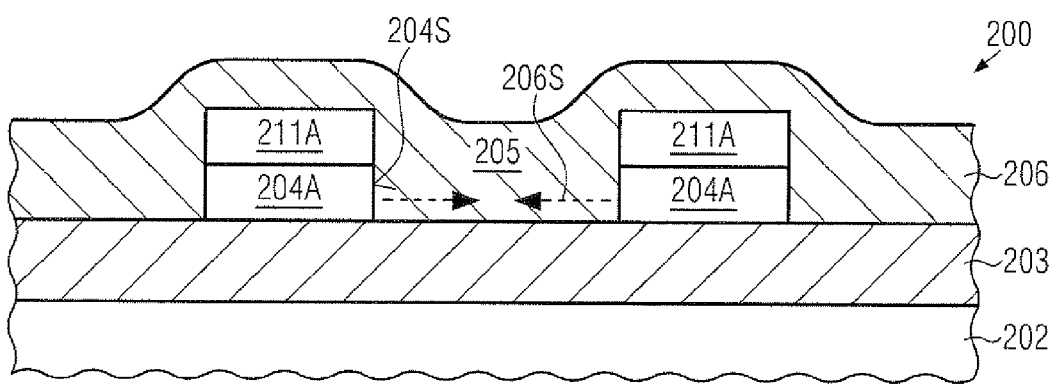
Figure 2D:
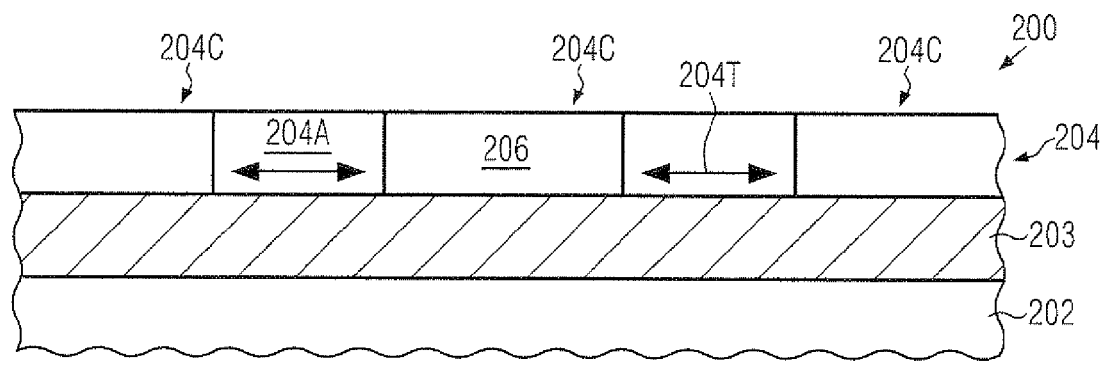
Figure 2E:
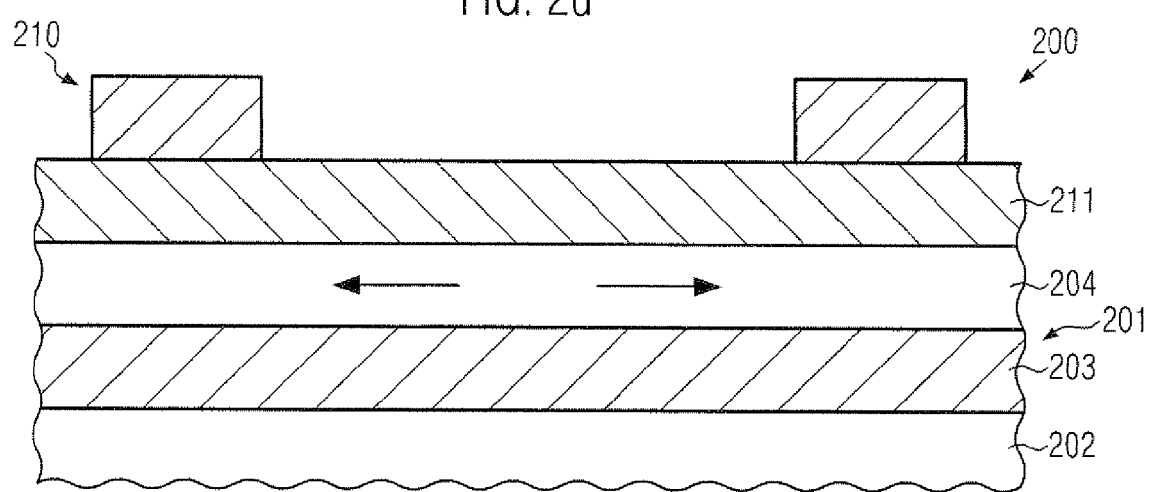
FIGS. 2e-2j schematically illustrate cross-sectional views of the semiconductor device during various manufacturing stages according to further illustrative embodiments, in which the initial strain may be efficiently relaxed in some active regions, while efficiently preserving the initial strain component in other active regions.
Figure 2F:
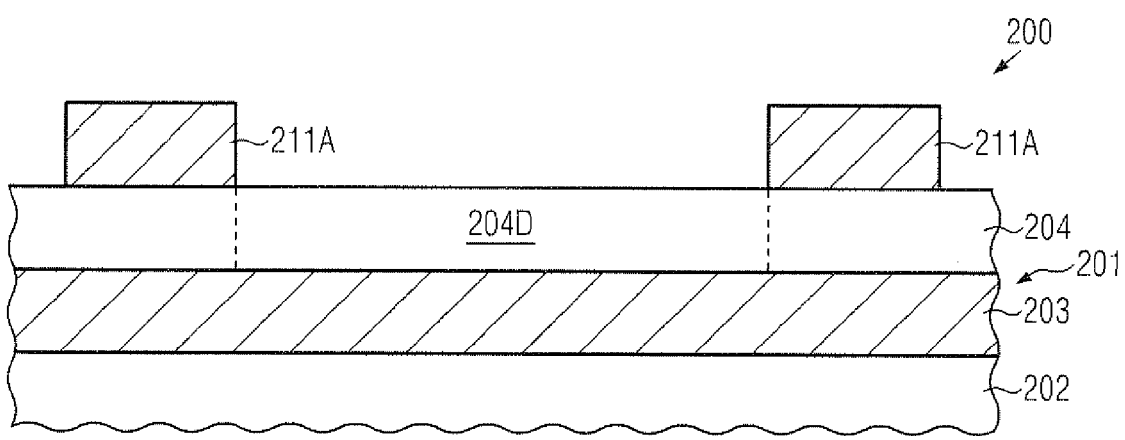
Figure 2G:
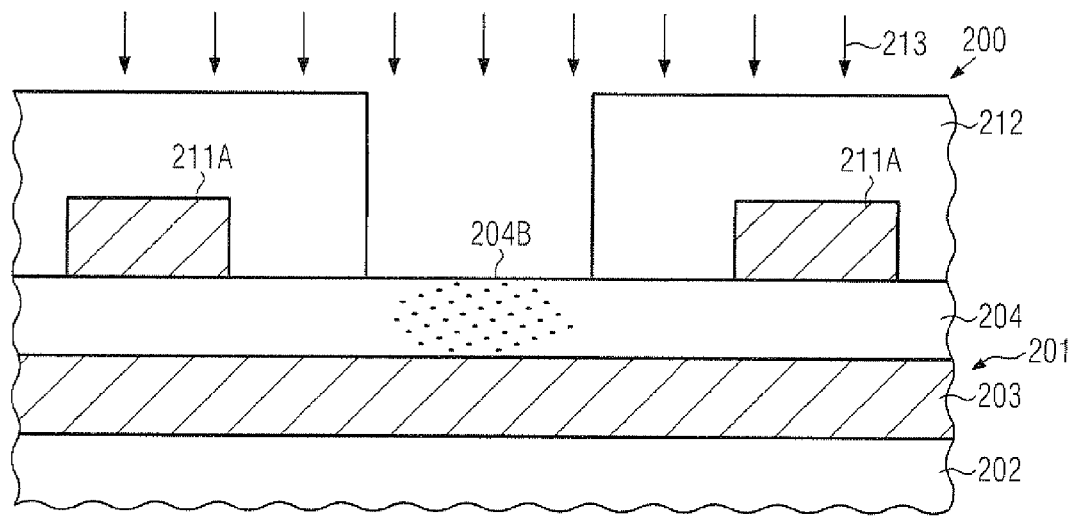
Figure 2H:
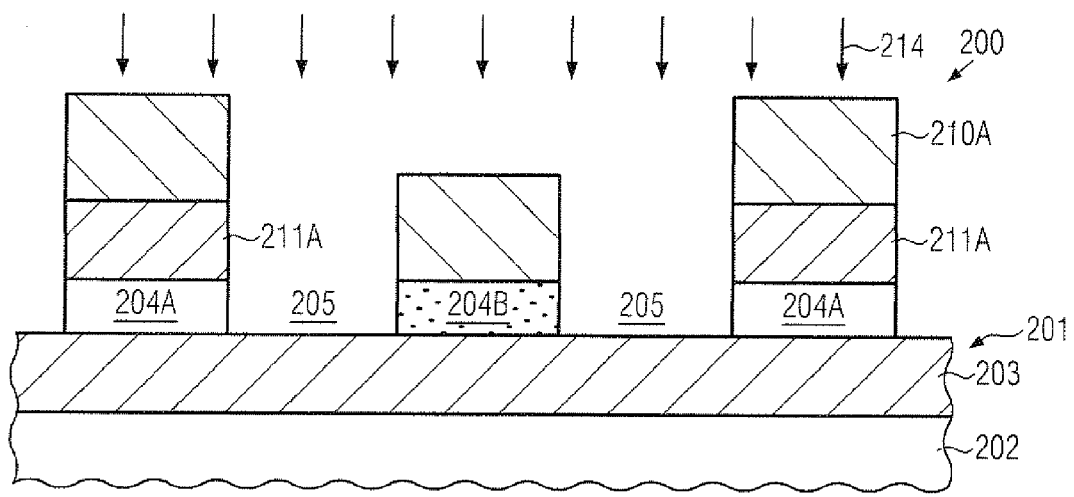
Figure 2I:
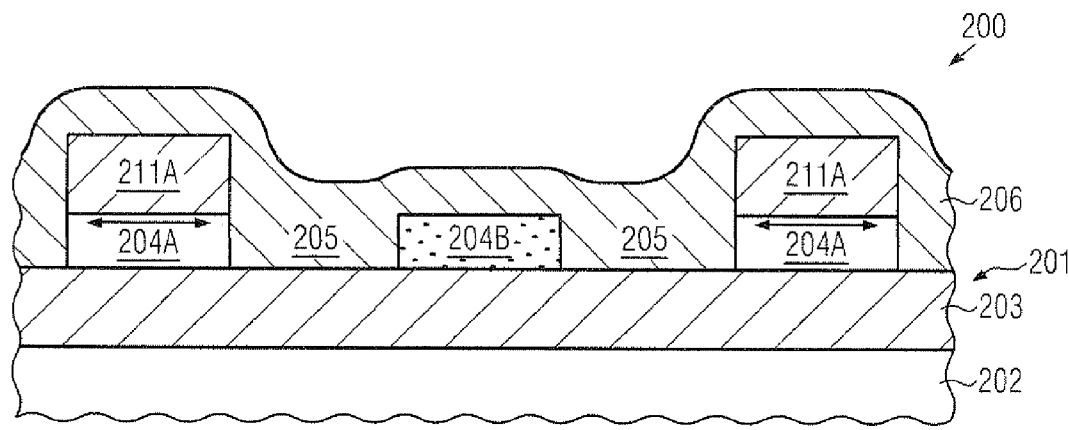
Figure 2J:
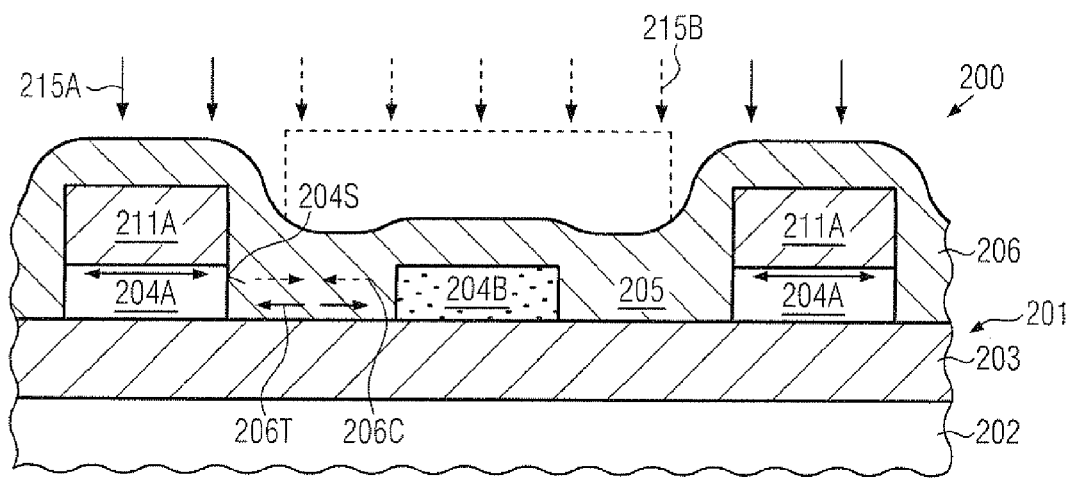
Figure 2K:
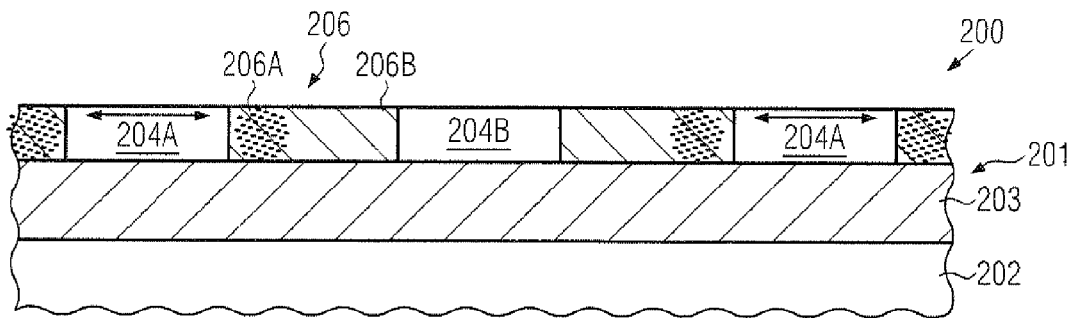
FIGS. 2k-2o schematically illustrate cross-sectional views of the semiconductor device during various manufacturing stages, in which an efficient strain conservation may be combined with creating a strain of inverse type in some active regions, according to still further illustrative embodiments.
Figure 2L:
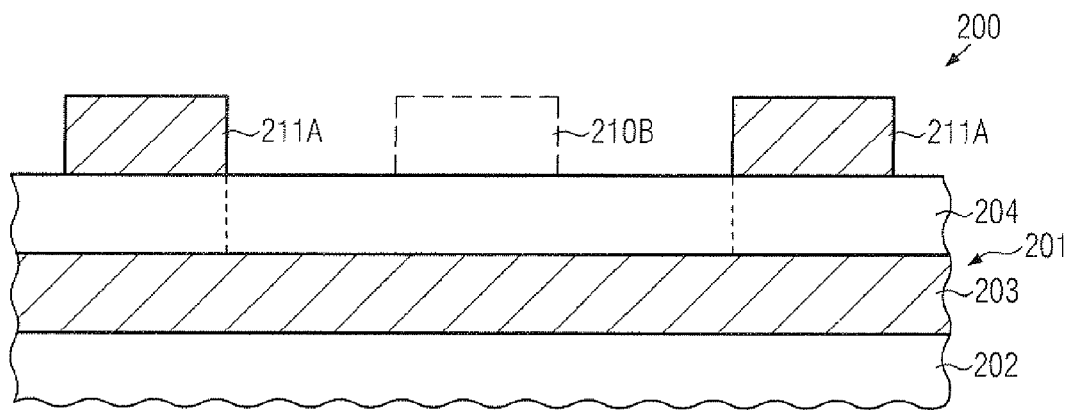
Figure 2M:
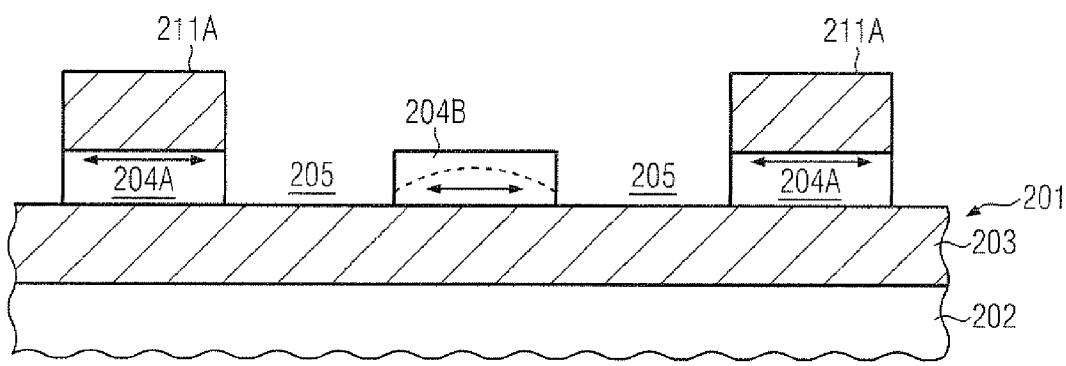
Figure 2N:
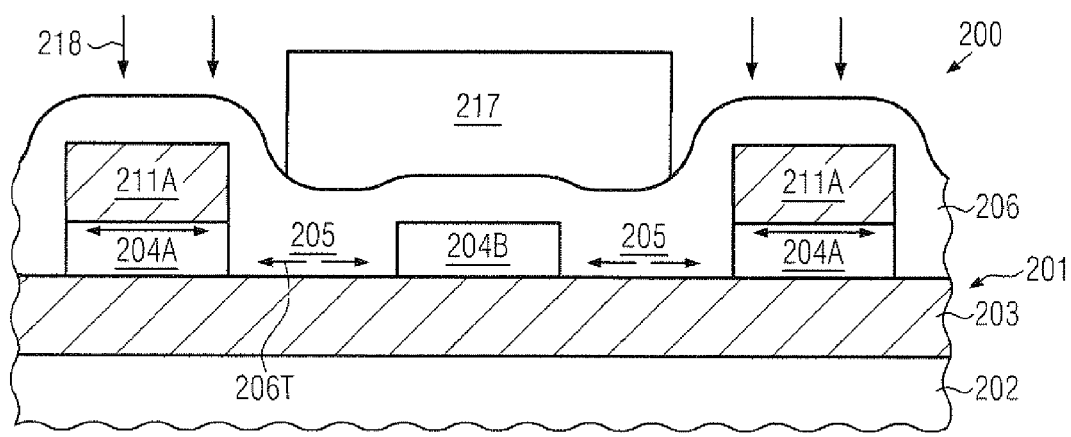
Figure 2O:
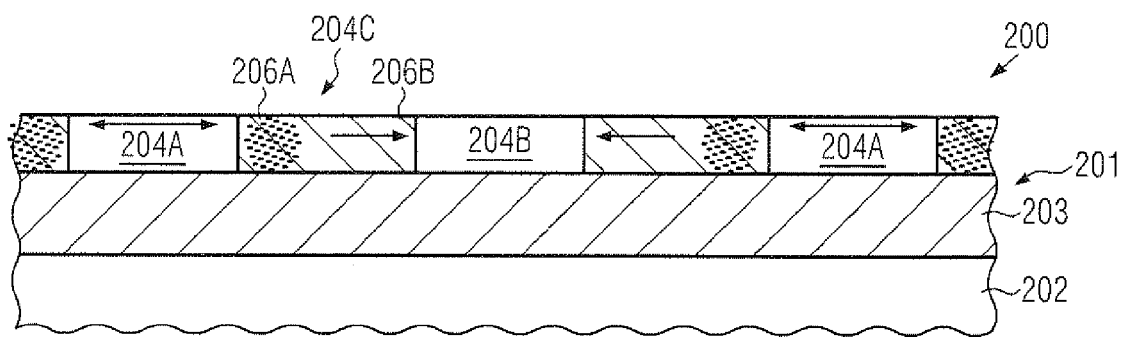
Figure 2P:
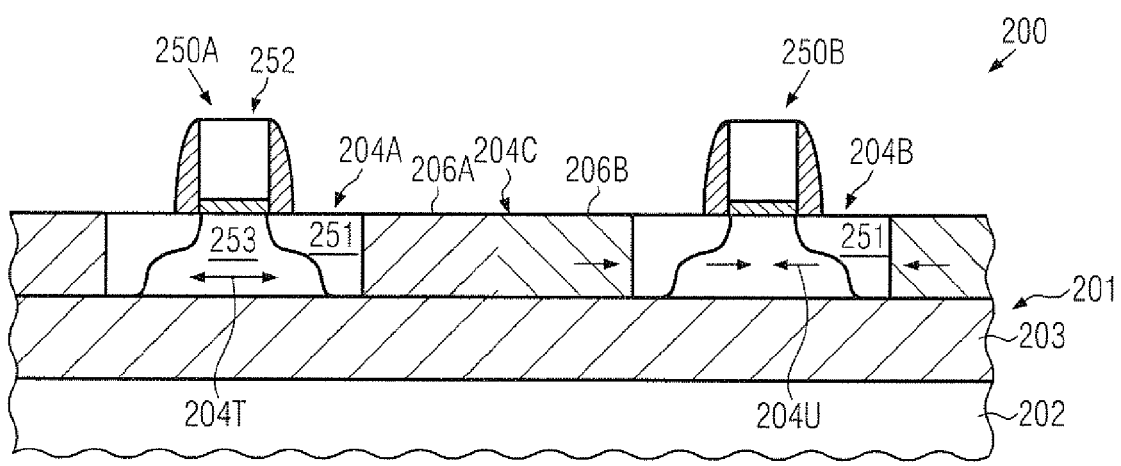
FIG. 2p schematically illustrates a cross-sectional view of the semiconductor device in a further advanced manufacturing stage, in which transistors may be formed in active regions provided from a globally strained semiconductor layer and requiring different strain conditions, according to still further illustrative embodiments.

With reference to FIGS. 2a-2p, further illustrative embodiments will now be described in more detail, wherein reference may also be made to FIGS. 1a-1f, if appropriate.

FIG. 2a schematically illustrates a cross-sectional view of a semiconductor device 200 comprising a substrate 201, which may include a base material 202 and a globally strained semiconductor layer 204, which may be provided in the form of a silicon-containing material and the like. In the embodiment shown, the substrate 201 may further comprise a buried insulating layer 203 formed between the base material 202 and the globally-strained semiconductor layer 204. With respect to any characteristics of the substrate 201, it may also be referred to the semiconductor substrate 101 as previously discussed with reference to FIGS. 1a and 1b. Consequently, the semiconductor layer 204 may have any appropriate biaxial strain, indicated by 204T, which may represent a tensile strain, a compressive strain and the like, depending on the overall process and device requirements. Furthermore, a mask layer 211 may be formed above the semiconductor layer 204 and may comprise two or more individual material layers, such as etch stop layers, CMP stop layers and the like, depending on the process strategy to be applied for patterning the semiconductor layer 204. The mask layer 211 may be considered as a substantially non-deformable material, i.e., the mechanical stability may be greater compared to the mechanical stability of the semiconductor material in the layer 204 so that, upon patterning the layers 211 and 204, the material 211 may reduce the mechanical deformation of a patterned portion of the material 204. For example, silicon nitride may represent an appropriate rigid material having a high mechanical stability when exposed to stress forces. Similarly, a thickness of the mask material 211 may be selected so as to provide the desired mechanical stability, wherein, in some illustrative embodiments, a thickness of the mask layer 211 may be 50-100% of the thickness of the semiconductor layer 204. In some illustrative embodiments, the mask material 211 may be provided with a high internal stress level, which may result in a strain component of the same type as the initial biaxial strain 204T. For example, when the semiconductor layer 204 is tensile-strained, i.e., the lattice constant of the semiconductor material 204 is greater than its natural unstrained lattice constant, the mask layer 211 may be provided with a tensile stress level or in a compressively strained state so as to have the tendency to expand, as indicated by 211S, so that the layer 211 may assist or may have the tendency to increase the tensile strain component 204T. It should be appreciated that a corresponding internal stress level, such as the stress level 211S, may be created upon forming at least one highly-stressed material, wherein the corresponding mechanical stress may be transferred into the material 204 via any intermediate materials, such as etch stop layers and the like, if provided.

Moreover, the semiconductor device 200 may comprise an etch mask 210, which may be appropriately configured so as to define the lateral size and position of active regions to be formed in the semiconductor layer 204. For example, the etch mask 210 may comprise a resist material, a hard mask material and the like.

The semiconductor device 200 as illustrated in FIG. 2a may be formed on the basis of the following processes. The substrate 201 may be provided with any desired global strain component 204T, as is, for instance, also described above with reference to the substrate 101. Thereafter, the material layer 211, possibly in combination with etch stop materials, CMP stop materials and the like, may be provided on the basis of well-established deposition techniques, such as plasma-assisted CVD, thermally-activated CVD, multi-layer deposition and the like, wherein, if desired, process parameters may be controlled such that a desired internal stress level may be achieved. For example, silicon nitride material may be provided with tensile or compressive internal stress up to several GPa by controlling the deposition parameters, such as gas flow rates, temperature, ion bombardment during the deposition and the like. It should be appreciated that the mask material 211 may also comprise various materials, such as refractory metal nitrides and the like, which may also be applied with high internal stress levels, wherein, additionally, a highly rigid material, such as silicon nitride and the like, may be provided in order to increase the overall mechanical stability. Next, the etch mask 210 may be formed on the basis of well-established lithography techniques based on lithography masks as required for forming sophisticated isolation structures. Next, the semiconductor device 200 may be exposed to any appropriate etch ambient, in which exposed portions of the mask material 211 may be removed. To this end, well-established plasma-assisted etch recipes may be applied, for instance for etching silicon nitride selectively with respect to the etch mask 210. By using the same etch chemistry or providing an additional etch chemistry, the corresponding etch process or an additional etch step may be applied so as to etch through the semiconductor layer 204, wherein the buried insulating material 203 may be used as an efficient etch stop material. During the etch process or after the etch process, the etch mask 210 may be removed on the basis of any appropriate process technique.

FIG. 2b schematically illustrates the semiconductor device 200 after the above-described process sequence. As illustrated, active regions 204A may be provided, which may be covered by mask materials 211A. Consequently, upon forming isolation trenches 205, which may laterally delineate the active regions 204A, the patterned mask materials 211A are present during the corresponding etch process, thereby avoiding or at least reducing the relaxing effect in the active regions 204A, when increasingly forming the sidewall surface areas 204S during the corresponding etch process. If an initial high stress level may be provided in the mask materials 211A, a corresponding relaxation may take place in this material, however, with a significantly reduced degree compared to the stress relaxation in semiconductor materials as previously explained with reference to FIGS. 1c-1f, so that at least a certain stress profile may be preserved, as indicated by 211S. Consequently, at least a certain stress may still act on the active regions 204A, thereby assisting in preserving or even increasing the initial strain component. In other illustrative embodiments, in which the mask materials 211A may be provided with a moderately low internal stress level or a substantially stress-free material, the mechanical stability may also reduce the degree of deformation in the action regions 204A, which may otherwise result in a certain degree of contraction, if initially provided in a tensile strained state. Consequently, the mask materials 211A may efficiently memorize the initial strain component in the active regions 204A upon providing the isolation trenches 205.

FIG. 2c schematically illustrates the semiconductor device 200 in a further advanced manufacturing stage. As shown, a material layer 206 may be formed so as to reliably fill the isolation trenches 205, which may be accomplished by any appropriate deposition technique, such as sub-atmospheric CVD, plasma-assisted CVD and the like. The material layer 206 may be comprised of any appropriate material, such as silicon dioxide, silicon nitride, a combination thereof and the like. In some illustrative embodiments, the material layer 206 may be provided with a certain internal stress level, as indicated by 206S, which may be accomplished by applying appropriate process parameters. For example, the internal stress level 206S may be selected such that superior strain conditions may be achieved in the active regions 204A upon removal of any excess material of the layer 206 and upon removal of the mask materials 211A. For example, due to the internal stress level 206S, the material 206 may tend to contract, which may also be referred to as a compressive stress level, so that a corresponding stress force may act on the sidewall surface areas 204S of the active regions 204A. In case of a tensile strained state of the active regions 204A, the stress component 206S may thus reduce any further stress relaxation due to the pulling force at the sidewall surface 204S. Thereafter, excess material of the layer 206 may be removed, for instance on the basis of a polishing process, an etch process and the like, wherein the mask materials 211A may be used as a stop material, when having a different material composition compared to the material layer 206. Thereafter, a further polishing process may be applied so as to commonly remove the mask materials 211A and any additional excess material of the layer 206 in the isolation trenches 205. It should be appreciated that, if required, any additional stop material may be provided in the mask materials 211A, as previously explained.

FIG. 2d schematically illustrates the semiconductor device 200 in a manufacturing stage in which the active regions 204A are laterally delineated by isolation structures 204C, which may comprise the material 206. Consequently, the material 206 may connect to the active regions 204A and may thus be mechanically coupled to these regions, thereby substantially maintaining the initial shape and size of the active regions 204A, even after removal of the mask materials 211A (FIG. 2c). Hence, a significant amount of the initial strain component 204T may still be preserved in the active regions 204A, which may, as previously explained, be further assisted by providing the material 206 in the form of a stressed material (FIG. 2c) and/or by providing the mask materials 211A in a highly stressed state. Consequently, by selecting the internal stress level of the mask materials 211A and/or of the material 206, a desired final strain component 204T in the active regions 204A may be adjusted for a given initial biaxial strain component of the semiconductor layer 204 (FIG. 2a).

Consequently, circuit elements, such as transistors, may be formed in and above the active regions 204A on the basis of a high strain component, which may be one GPa and higher.

FIG. 2e schematically illustrates the semiconductor device 200 in a manufacturing stage in which the etch mask 210 may be provided above the mask layer 211 so as to cover portions thereof, which may correspond to active regions requiring a high strain component. On the other hand, an active region is to be provided laterally between the active regions corresponding to the etch mask 210, wherein the mask material 211 may be removed in this area so as to avoid strain memorization. With respect to forming the etch mask 210 and the mask material 211, the same criteria may apply as previously explained. Thereafter, an appropriate plasma-assisted etch process may be performed, for instance on the basis of an etch chemistry for etching silicon nitride material selectively with respect to silicon material, for which purpose a plurality of well-established etch recipes are available. It should be appreciated that an additional etch stop material, such as a silicon dioxide material and the like, may be incorporated in the mask material 211 and may be used for controlling the corresponding etch process. In this case, the bulk material of the layer 211 may be removed and the etch process may be stopped on the basis of the etch stop liner, which in turn may be removed on the basis of any appropriate etch chemistry, such as wet chemical etch chemistries and the like. During or after the etch process, the etch mask 210 may also be removed, for instance by resist strip processes and the like.

FIG. 2f schematically illustrates the semiconductor device 200 with the hard mask material portions 211A formed above the semiconductor layer 204. Thus, a portion 204D of the semiconductor layer 204 may be exposed and may correspond to an area in which isolation structures and an intermediate active region are to be formed in a later manufacturing stage.

FIG. 2g schematically illustrates the semiconductor device 200 in a further advanced manufacturing stage. As illustrated, an implantation mask 212, such as a resist mask, may be provided so as to determine the lateral position and size of an active region 204B in the semiconductor layer 204. The active region 204B may represent an active region in which a significant reduction of the initial strain level is considered appropriate for the further processing. To this end, a strain relaxation may be initiated, for instance by performing an ion implantation process 213, for instance by using xenon, or any other heavy implantation species, thereby reducing or relaxing the internal stress level in the active region 204B, without unduly damaging the overall crystalline structure. It should be appreciated that appropriate process parameters of the process 213 may be readily determined on the basis of simulation, experiments and the like.

FIG. 2h schematically illustrates the semiconductor device 200 with an etch mask 210A, which may appropriately define the lateral position and size of the isolation trenches 205, which may thus laterally delineate the active regions 204A and the active region 204B. To this end, any appropriate plasma-assisted etch process 214 may be applied on the basis of the etch mask 210A, wherein, due to the presence of the mask materials 211A above the active regions 204A, the desired strain conservation may be achieved, as previously discussed, whereas an efficient stress relaxation may be accomplished in the active region 204B.

FIG. 2*i* schematically illustrates the semiconductor device 200 with the dielectric fill material 206 formed in the isolation trenches 205 and above the active regions 204A, 204B. As previously discussed, the dielectric material 206 may comprise any appropriate material or materials so as to provide the desired dielectric characteristics and an appropriate mechanical connection to the active regions 204A, 204B. Consequently, by providing the material 206 in the presence of the mask materials 211A, the strained state of the active regions 204A may be substantially preserved, while, in the active region 204B, the substantially relaxed state may be maintained, as required for forming circuit elements therein, in which the initial strain of the semiconductor layer (FIG. 2*a*) may be considered inappropriate. Thereafter, any excess material of the layer 206 and the mask materials 211A may be removed, for instance by chemical mechanical polishing, etching and the like, as is also previously discussed.

FIG. 2*j* schematically illustrates the semiconductor device 200 according to further illustrative embodiments in which the material layer 206 may comprise a moderately high internal stress level, as is also previously discussed. For example, the material 206 may have an internal stress level 206T, which may result in a tendency of the material 206 to expand, which may be considered inappropriate for a tensile strain level of the active regions 204A upon interacting with the sidewall surface areas 204S. On the other hand, the internal stress level 206T may result in a desired strain component in the active region 204B, thereby converting the substantially neutral strain condition therein into a strained state that is inverse to the strain state of the active regions 204A. In this case, a selective ion bombardment 215A may be applied, for instance by providing an appropriate implantation mask, thereby significantly relaxing the stress level 206T selectively around the active regions 204A, while preserving the stress level 206T selectively around the active region 204B. Consequently, a negative influence of the stress level 206T on the active regions 204A may be significantly reduced, while nevertheless still preserving at least a significant fraction of the external stress level 206T, which may thus induce a desired type of strain in the active region 204B. In other illustrative embodiments, an internal stress level 206C may be established in the material 206, which may have a positive effect for the strain conditions in the active regions 204A, while, on the other hand, adversely affecting the active region 204B. In this case, a selective ion bombardment 215B may be applied, for instance by providing an appropriate mask, so as to selectively relax the material 206 around the active region 204B, while substantially maintaining the stress level 206C in the material 206 surrounding the active regions 204A. Hence, the active region 204B may be preserved in its substantially relaxed state, while a superior strain condition may be established in the active regions 204A upon and after removal of any excess portion of the material 206 and after removal of the mask materials 211A.

FIG. 2*k* schematically illustrates the semiconductor device 200 in a further advanced manufacturing stage, i.e., after the removal of the excess material 206 and the mask materials 211A of FIG. 2*j*. As illustrated, the active region 204B may be provided in a substantially relaxed strain condition, when the material 206 may be provided in the form of a substantially non-stressed dielectric material. Moreover, the strain in the active regions 204A may be preserved, at least to a higher degree, due to the provision of the mask materials 211A (FIG. 2*j*). In still other illustrative embodiments, the material 206 may be provided in the form of a first material portion 206A positioned adjacent to the active regions 204A and having a desired internal stress level so as to provide superior strain conditions in the active regions 204A. On the other hand, a portion 206B laterally enclosing the active region 204B may be provided in a substantially relaxed stress state, thereby not negatively affecting the active region 204B. In other cases, as previously discussed, the portion 206B may have an appropriate internal stress level so as to induce a certain strain in the active region 204B that may be appropriate for enhancing performance of any circuit elements to be formed therein. In this case, the material portion 206A may represent a substantially relaxed material in order to not unduly affect the strain conditions in the active regions 204A. Consequently, the further processing may be continued on the basis of a desired high strain component in the active regions 204A, while a substantially relaxed crystalline material or material of inverse strain conditions may be provided in the active region 204B.

FIG. 2*l* schematically illustrates the semiconductor device 200 according to further illustrative embodiments in which the mask materials 211A may be provided above the semiconductor layer 204 and an etch mask 210B may define the lateral size and position of an active region in the layer 204 in which a strain may have to be established that is inverse to the type of strain initially provided in the semiconductor layer 204. The mask materials 211A may be formed in accordance with any process technique as previously described, while the etch mask 210B may be provided on the basis of sophisticated lithography techniques using resist materials, hard mask materials and the like. It should be appreciated that, if required, a portion of the etch mask 210B may also be formed above the materials 211A, if an etch resistivity thereof is considered inappropriate during the subsequent anisotropic etch process. Consequently, based on the etch mask 210B, the semiconductor layer 204 may be patterned so as to form corresponding isolation trenches therein.

FIG. 2*m* schematically illustrates the semiconductor device 200 with the active regions 204A still covered by the mask materials 211A and thus still having a significant fraction of the initial strain component of the semiconductor layer 204 (FIG. 2*a*). On the other hand, an active region 204B may have experienced a significant strain relaxation, as is also previously explained with reference to FIGS. 1*c*-1*f*.

FIG. 2*n* schematically illustrates the semiconductor device 200 with the dielectric fill material 206 formed in the isolation trenches 205 and above the active regions 204A, 204B. The material 206 may be provided with a high internal stress level 206T so as to induce a desired strain component in the active region 204B, for instance in the form of a compressive strain, when the active regions 204A may be provided in a tensile strained state. To this end, the material 206 may be deposited on the basis of any appropriate deposition techniques which may result in the desired internal stress level 206T. Since the internal stress level 206T may have a stress relaxing effect on the active regions 204A, an appropriate implantation mask 217 may be provided so as to expose the material 206 surrounding the active regions 204A. Thereafter, an ion implantation process 218 may be performed, for instance by using xenon, thereby efficiently relaxing the internal stress level of exposed areas of the material layer 206.

FIG. 2o schematically illustrates the semiconductor device 200 after the removal of the mask 217 and excess material of the layer 206 and after removal of the mask materials 211A (FIG. 2n). Consequently, the active regions 204A, 204B are laterally delineated by the isolation structures 204C comprising the material portions 206A, 206B of substantially relaxed stress state and a high internal stress level, respectively, in order to obtain a desired strain state in the active region 204B without unduly affecting the strain conditions in the active regions 204A.

Consequently, an inverse type of strain may be established in the active region 204B without requiring a relaxation implantation therein, which may be advantageous in terms of reduced lattice damage and the like. Thereafter, the further processing may be continued by forming circuit elements, such as transistors and the like.

FIG. 2p schematically illustrates the semiconductor device 200 in a further advanced manufacturing stage. As illustrated, a first transistor 250A may be formed in and above the active region 204A and may have any appropriate configuration, such as a planar configuration, a three-dimensional configuration and the like. In the example shown, the transistor 250A may have formed drain and source regions 251 in the active region 204A, which are laterally separated by a channel region 253. Moreover, a gate electrode structure 252 may be formed on the active region 204A. Similarly, a second transistor 250B may be formed in and above the active region 204B and may represent a planar transistor, a three-dimensional transistor and the like. In the embodiment shown, the active region 204B may have a strain 204U which may be of inverse type compared to the strain component 204T, which may represent at least a significant fraction of the initial strain component of the semiconductor layer 204 (FIG. 2a). For example, the isolation structure 204C may comprise a highly stressed material portion 206B, which may induce, at least partially, the strain component 204U in the active region 204B, possibly in combination with additional strain-inducing mechanisms (not shown). On the other hand, the material portion 206A may substantially not negatively affect the strain 204T in the active region 204A, which may be accomplished on the basis of any of the above-described process techniques.

The transistors 250A, 250B may be formed on the basis of any appropriate process technique, depending on the overall device configuration and the process requirements.

As a result, the present disclosure provides manufacturing techniques and semiconductor devices in which the strain of a globally strained semiconductor layer may be preserved with a high degree, at least in one type of active regions, by using an appropriate rigid mask material upon patterning isolation trenches and refilling the trenches to form shallow trench isolation structures. On the other hand, the high initial strain component may be significantly reduced or relaxed in other active regions by avoiding the presence of the mask material upon forming the isolation structures, wherein, in some illustrative embodiments, even strains of inverse type may be induced on the basis of a selectively provided high internal stress level of the dielectric material of the isolation structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a silicon-containing semiconductor layer above a substrate, said silicon-containing semiconductor layer having a biaxial strain and then;
forming a rigid patterned mask material above said silicon-containing semiconductor layer, said rigid patterned mask material having the same type of biaxial strain as said silicon-containing semiconductor layer and then;
forming an isolation trench in said silicon-containing semiconductor layer in the presence of said rigid patterned mask material so as to laterally delineate an active region, said rigid patterned mask material reducing a strain relaxation in said active region and then;
filling said isolation trench with a dielectric material in the presence of said rigid patterned mask material so as to form a trench isolation structure; and then
removing said rigid patterned mask material from said active region.

2. The method of claim 1, wherein filling said isolation trench with a dielectric material comprises depositing a material layer so as to have an internal stress level.

3. The method of claim 1, wherein forming said isolation trench further comprises forming said isolation trench so as to laterally delineate a second active region that is not covered by said rigid patterned material.

4. The method of claim 3, further comprising relaxing a strain component in said second active region.

5. The method of claim 4, wherein filling said isolation trench with a dielectric material comprises forming a strain-inducing dielectric material selectively adjacent to said second active region so as to provide a strain therein that is inverse to said strain in said active region.

6. The method of claim 5, wherein forming a strain-inducing dielectric material selectively adjacent to said second active region comprises forming said strain-inducing material in said isolation trench and selectively relaxing an internal stress adjacent to said active region.

7. The method of claim 6, wherein selectively relaxing an internal stress comprises performing an ion implantation process.

8. The method of claim 1, wherein said isolation trench is formed so as to extend to a buried insulating layer formed between said substrate and said silicon-containing semiconductor layer.

9. The method of claim 1, wherein said silicon-containing semiconductor layer has a biaxial tensile strain.

10. A method, comprising:
forming a patterned mask material above a strained silicon-containing semiconductor layer formed above a substrate of a semiconductor device, wherein said strained silicon-containing semiconductor layer has a biaxial strain and said patterned mask material has the same type of biaxial strain as said silicon-containing semiconductor layer and then;
forming an isolation structure in said strained silicon-containing semiconductor layer in the presence of said patterned mask material, said isolation structure laterally delineating in said strained silicon-containing semiconductor layer a first active region below said patterned mask material and a second active region laterally offset from said patterned mask material wherein said mask material is provided so as to reduce a strain relaxation in said first active region; and then removing said patterned mask material.

11. The method of claim 10, further comprising relaxing a strain level in a portion of said strained silicon-containing semiconductor layer prior to forming said isolation structure, wherein said portion corresponds to at least said second active region.

12. The method of claim 11, further comprising relaxing a strain level in a portion of said strained silicon-containing semiconductor layer after forming an isolation trench of said isolation structure.

13. The method of claim 10, wherein forming said isolation structure comprises providing a dielectric material having an internal stress level so as to increase a strain in one of said first and second active regions.

14. The method of claim 13, wherein providing said dielectric material comprises depositing said dielectric material with said internal stress level and reducing said internal stress level selectively in a portion of said dielectric material.

* * * * *

UNITED STATES PATENT AND TRADEMARK OFFICE
CERTIFICATE OF CORRECTION

PATENT NO. : 8,329,531 B2
APPLICATION NO. : 12/917870
DATED : December 11, 2012
INVENTOR(S) : Jan Hoentschel et al.

It is certified that error appears in the above-identified patent and that said Letters Patent is hereby corrected as shown below:

Col. 16, line 31 (claim 3, line 4), after "patterned" insert -- mask --.

Signed and Sealed this
Nineteenth Day of February, 2013

Teresa Stanek Rea
*Acting Director of the United States Patent and Trademark Office*